(12) United States Patent
Lee et al.

(10) Patent No.: US 10,141,481 B2
(45) Date of Patent: Nov. 27, 2018

(54) COLOR-CONVERTING SUBSTRATE OF LIGHT-EMITTING DIODE AND METHOD FOR PRODUCING SAME

(71) Applicant: Corning Precision Materials Co., Ltd., Chungcheongnam-do (KR)

(72) Inventors: Ki Yeon Lee, Chungcheongnam-do (KR); Jhee Mann Kim, Chungcheongnam-do (KR); Hyung Soo Moon, Chungcheongnam-do (KR); Yoon Seuk Oh, Chungcheongnam-do (KR); Choon Bong Yang, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/301,543

(22) PCT Filed: Mar. 24, 2015

(86) PCT No.: PCT/KR2015/002853
§ 371 (c)(1),
(2) Date: Oct. 3, 2016

(87) PCT Pub. No.: WO2015/152555
PCT Pub. Date: Oct. 8, 2015

(65) Prior Publication Data
US 2017/0040511 A1     Feb. 9, 2017

(30) Foreign Application Priority Data

Apr. 4, 2014   (KR) .................. 10-2014-0040300

(51) Int. Cl.
*H01L 33/50*   (2010.01)
*H01L 33/06*   (2010.01)
(Continued)

(52) U.S. Cl.
CPC .......... *H01L 33/50* (2013.01); *H01L 25/0753* (2013.01); *H01L 33/06* (2013.01);
(Continued)

(58) Field of Classification Search
CPC ........ H01L 33/50–33/508; H01L 33/06; H01L 33/483; H01L 33/52–33/56
See application file for complete search history.

(56) References Cited

U.S. PATENT DOCUMENTS

2007/0176549 A1*  8/2007  Park ..................... C03C 8/02
                                                          313/512
2013/0223922 A1*  8/2013  Koval ................. C03B 23/245
                                                          403/270

FOREIGN PATENT DOCUMENTS

JP     2012124123 A    6/2012
KR   20130009022 A    1/2013
(Continued)

OTHER PUBLICATIONS

International Search Report for Application No. PCT/KR2015/002853 dated Jul. 6, 2015.

*Primary Examiner* — Laura M Menz
*Assistant Examiner* — Candice Chan
(74) *Attorney, Agent, or Firm* — Lerner, David, Littenberg, Krumholz & Mentlik, LLP

(57) ABSTRACT

The present invention relates to a color-converting substrate of a light-emitting diode and a method for producing same, and more specifically to a color-conversion substrate of a light-emitting diode capable of completely protecting the quantum dots (QDs) supported in the interior from the exterior as hermetic sealing is possible, and a method for producing the color-converting substrate. To that end, provided are a color-conversion substrate of a light-emitting diode and a method for producing same, the color-conversion substrate of a light-emitting diode comprising: a first
(Continued)

substrate arranged on a light-emitting diode; a second substrate disposed facing the first substrate; a first sealing material disposed on the upper surface of the first substrate so as to section a grooved accommodating space having the first substrate as the bottom surface thereof; QDs filling the accommodating space; and a second sealing material, disposed between the second substrate and the first sealing material, having a shape corresponding to the first sealing material, wherein the second sealing material is made of material having a comparatively higher laser absorption rate in the infrared region than that of the first sealing material.

6 Claims, 4 Drawing Sheets

(51) Int. Cl.
 *H01L 33/52* (2010.01)
 *H01L 25/075* (2006.01)
 *H01L 33/56* (2010.01)

(52) U.S. Cl.
 CPC ............ *H01L 33/502* (2013.01); *H01L 33/52* (2013.01); *H01L 33/56* (2013.01); *H01L 2924/0002* (2013.01); *H01L 2933/005* (2013.01); *H01L 2933/0041* (2013.01)

(56) References Cited

FOREIGN PATENT DOCUMENTS

| KR | 20130110946 A | 10/2013 |
| KR | 20130121609 A | 11/2013 |

* cited by examiner

COLOR-CONVERTING SUBSTRATE OF LIGHT-EMITTING DIODE AND METHOD FOR PRODUCING SAME

CROSS-REFERENCE TO RELATED APPLICATION

This application is a national phase entry under 35 U.S.C. § 371 of International Application No. PCT/KR2015/002853, filed Mar. 24, 2015, published in Korean, which claims priority to Korean Patent Application No. 10-2014-0040300, filed on Apr. 4, 2014, the disclosures of which are incorporated herein by reference.

BACKGROUND OF THE INVENTION

Field of the Invention

The present invention relates to a color conversion substrate for a light-emitting diode (LED) and a method of fabricating the same. More particularly, the present invention relates to a color conversion substrate for an LED and a method of fabricating the same able to form a hermetic seal, thereby entirely protecting a quantum dot (QD) accommodated in the color conversion substrate from the external environment.

Description of Related Art

A light-emitting diode (LED) is a semiconductor device formed of a compound such as gallium arsenide (GaAs) to emit light when an electrical current is applied thereto. The LED uses a p-n junction of a semiconductor into which minority carriers, such as electrons or holes, are injected, such that light is generated by the recombination of the minority carriers.

The characteristics of LEDs include low power consumption, a relatively long lifespan, the ability to be mounted in cramped spaces, and resistance to vibrations. In addition, LEDs are used in display devices and in backlight units of display devices. Recently, studies into applying LEDs to general illumination devices have been undertaken. In addition to monochromatic LEDs, such as red, blue, or green LEDs, white LEDs have come into the market. In particular, a sharp increase in demand for white LEDs is expected, since white LEDs can be applied to vehicles and lighting apparatuses.

In the field of LED technology, white light is commonly generated using two major methods. The first method to generate white light includes disposing monochromatic LEDs, such as red, green, and blue LEDs, adjacently to each other such that light emitted by the monochromatic LEDs having various colors is mixed. However, color tones may change depending on the environment in which such devices are used, since individual monochromatic LEDs have different thermal or temporal characteristics. In particular, color stains may occur, making it difficult to uniformly mix different colors of light. The second method to generate white light includes applying a fluorescent material to an LED and mixing part of initial light emitted by the LED and secondary light wavelength-converted by the fluorescent material. For example, a fluorescent material generating yellowish-green or yellow light may be used as a light excitation source on a blue LED, whereby white light can be produced by mixing blue light emitted by the blue LED and yellowish-green or yellow light excited by the fluorescent material. At present, the method of realizing white light using a blue LED and a fluorescent material is generally used.

Currently, a quantum dot (QD) generating strong light having a narrower wavelength than that of a typical fluorescent material is used as a color conversion material. In general, a QD-LED backlight generates white light by irradiating a yellow QD with blue light emitted by a blue LED, and supplies the white light as backlight to a liquid crystal display (LCD). LCDs using such a QD-LED backlight has high potential as new displays, since the characteristics of these LCDs include superior color reproduction unlike those using a traditional backlight using LEDs only, ability to realize full color comparable to that of LEDs, and lower fabrication costs and higher productivity than LED TVs.

In the related art, a method of fabricating such a QD-LED includes: forming a QD sheet by mixing a QD with polymer; and subsequently coating the QD sheet with a plurality of barrier layers in order to protect the sheet surface from outside moisture or the like and maintain the lifespan. However, this related-art method is problematic in that fabrication costs are expensive due to the barrier layers having to be applied several times, and most of all, this method fails to entirely protect the QD from the external environment.

In addition, another method used in related art includes: etching a glass surface to a certain depth; inputting a QD into the etched portion of the glass surface; covering the resultant structure with a cover glass; applying low melting point glass on the peripheries; sintering the applied low melting point glass; and sealing the resultant structure using a laser beam. However, the etching process causes fabrication costs to be expensive. In particular, it is difficult to use a thin glass plate.

The information disclosed in the Background of the Invention section is only provided for better understanding of the background of the invention and should not be taken as an acknowledgment or any form of suggestion that this information forms prior art that would already be known to a person skilled in the art.

RELATED ART DOCUMENT

Patent Document 1: Japanese Unexamined Patent Publication No. 2012-124123 (Jun. 28, 2012).

BRIEF SUMMARY OF THE INVENTION

Various aspects of the present invention provide a color conversion substrate for a light-emitting diode (LED) and a method of fabricating the same able to form a hermetic seal, thereby entirely protecting a quantum dot (QD) accommodated in the color conversion substrate from the external environment.

In an aspect of the present invention, provided is a color conversion substrate for an LED. The color conversion substrate includes: a first substrate disposed over the LED; a second substrate facing the first substrate; a first sealant disposed on the top surface of the first substrate, defining a recess-shaped accommodation space having the top surface of the first substrate as a bottom surface thereof; a QD accommodated in the accommodation space; and a second sealant disposed between the second substrate and the first sealant, in the shape corresponding to a shape of the first sealant. The second sealant is formed of a material, the ability to absorb infrared (IR) laser light of which is greater than that of the first sealant.

According to an embodiment of the invention, each of the first substrate and the second substrate may be formed of a glass substrate. Each of the first sealant and the second sealant substrate may be formed of a glass frit.

Here, the softening point of the glass frit of the first sealant may be lower than the softening point of the first substrate.

The softening point of the glass frit of the second sealant may be lower than the softening point of the glass frit of the first sealant.

The composition of the second sealant may include, by weight, 2 to 10% of a black pigment.

The height of the first sealant formed on the top surface of the first substrate may range from 300 to 500 μm.

In another aspect of the present invention, provided is a method of fabricating a color conversion substrate for an LED. The method includes: forming a first sealant on the top surface of a first substrate under which an LED is disposed, defining a recess-shaped accommodation space having the first substrate as the bottom surface thereof; inputting a QD into the accommodation space; aligning a second sealant and a second substrate on the first sealant, the second substrate being disposed on the second sealant and facing the first substrate, such that the second sealant is positioned on the first sealant in the shape corresponding to a shape of the first sealant, the ability to absorb IR laser light of the second sealant being greater than that of the first sealant; and laser-sealing the first substrate, the first sealant, the second sealant, and the second substrate to each other by irradiating the second sealant with a laser beam.

According to an embodiment of the invention, the operation of aligning the second sealant and the second substrate includes forming the second sealant on the first sealant and subsequently disposing the second substrate on the second sealant.

The operation of aligning the second sealant and the second substrate may include applying the second sealant on the bottom surface of the second substrate and subsequently disposing the second substrate on the first sealant such that the second sealant comes into close contact with the first sealant.

Each of the first substrate and the second substrate may be formed of a glass substrate. Each of the first sealant and the second sealant may be formed of a paste of glass frit.

The softening point of the glass frit of the first sealant may be lower than the softening point of the first substrate.

The softening point of the glass frit of the second sealant may be lower than the softening point of the glass frit of the first sealant.

The composition of the second sealant may include, by weight, 2 to 10% of a black pigment.

The operation of forming the first sealant may include forming the first sealant such that a plurality of accommodation spaces is defined on the top surface of the first substrate. The method may further include, after the operations of inputting the QD, aligning the second sealant and the second substrate, and laser-sealing are sequentially performed for each of the plurality of accommodation spaces, dicing a resultant structure into cells defined by the first sealant and the second sealant.

According to the present invention as set forth above, a first sealant, the coefficient of thermal expansion (CTE) is the same as the CTE of a lower substrate formed of glass, is applied on the lower substrate, defining a recess-shaped accommodation space having the lower glass as the bottom surface thereof. Subsequently, a QD is input into the accommodation space defined by the lower substrate and the first sealant. Thereafter, a second sealant and an upper substrate formed of glass are sequentially disposed on the first sealant, such that the second sealant, the ability to absorb IR laser light of which is greater than that of the first sealant, is positioned on the first sealant in the shape corresponding to the shape of the first sealant. Afterwards, the upper substrate, the lower substrate, the first sealant, and the second sealant are sealed to each other by laser sealing, such that only the second sealant having the higher ability to absorb IR laser light can be locally heated, thereby protecting the first sealant from cracks that would otherwise be caused by a thermal shock. The can consequently provide a fabricated color conversion substrate for an LED with a hermetic seal, thereby entirely protecting the QD accommodated in the color conversion substrate from the external environment.

In addition, according to the present invention, related-art processing, such as multilayer coating intended to protect the QD or etching, is omitted. It is therefore possible to reduce fabrication costs compared to that of the related art and remove limitations in the thickness of the substrate.

DETAILED DESCRIPTION OF THE INVENTION

Figure 1:
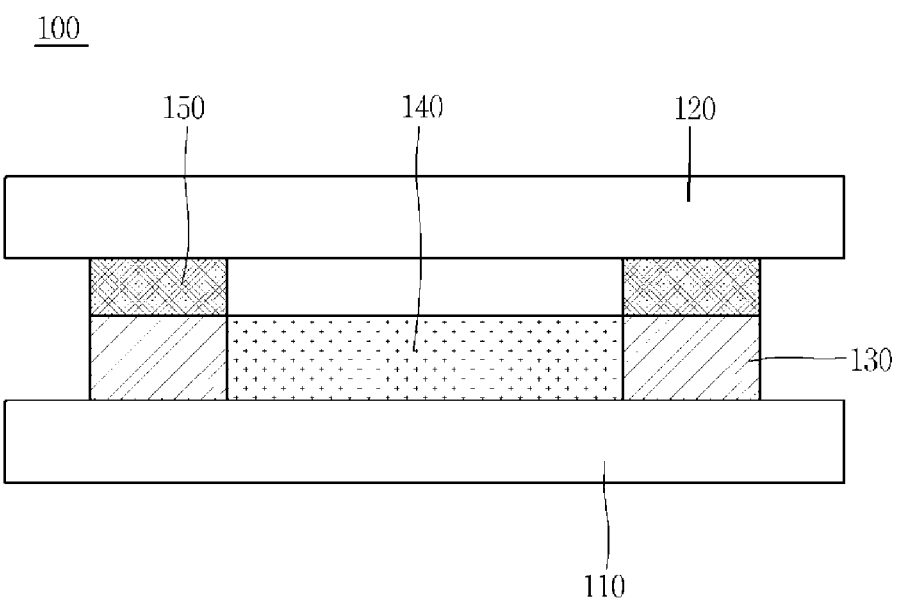
FIG. 1 is a cross-sectional view illustrating a color conversion substrate for an LED according to an exemplary embodiment of the present invention.

Reference will now be made in detail to a color conversion substrate for a light-emitting diode (LED) and a method of fabricating the same according to the present invention, embodiments of which are illustrated in the accompanying drawings and described below, so that a person skilled in the art to which the present invention relates could easily put the present invention into practice.

Throughout this document, reference should be made to the drawings, in which the same reference numerals and symbols are used throughout the different drawings to designate the same or similar components. In the following description of the present invention, detailed descriptions of known functions and components incorporated herein will be omitted in the case that the subject matter of the present invention is rendered unclear.

Figure 2:
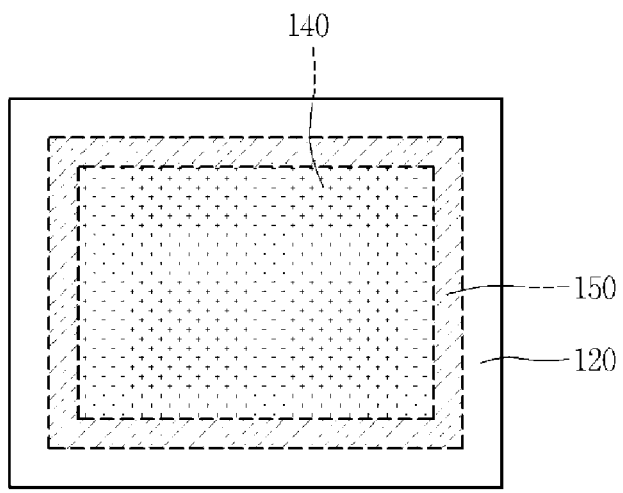
FIG. 2 is a top plan view illustrating the color conversion substrate for an LED illustrated in FIG. 1.

As illustrated in FIG. 1 and FIG. 2, a color conversion substrate 100 according to an exemplary embodiment of the present invention is a substrate disposed over an LED to convert the color of a portion of light emitted by the LED while sealing the LED. Consequently, an LED package including the color conversion substrate 100 and the LED radiates white light in which, for example, blue light emitted by a blue LED and color-converted light from the color conversion substrate 100 are mixed. Although not illustrated in the drawings, the LED includes a body and an LED chip. The body of the LED is a structure having an opening of a predetermined shape, providing a structural space in which the LED chip is mounted. The body may have wires and a lead frame by which the LED chip is electrically connected to an external power source. In addition, the LED chip is mounted on the body, and serves as a light source emitting light using an external current. The LED chip is implemented as a forward junction of an n-semiconductor layer that provides electrons and a p-semiconductor layer that provides holes.

The color conversion substrate 100 according to this embodiment disposed over the LED as above includes a first substrate 110, a second substrate 120, a first sealant 130, a quantum dot (QD) 140, and a second sealant 150.

The first substrate 110 is disposed over the LED. The second substrate 120 is disposed such that the second substrate 120 faces the first substrate 110. The first substrate 110 and the second substrate 120 are spaced apart from each other by means of the first sealant 130, the QD 140, and the second sealant 150 that are interposed therebetween. The first substrate 110 and the second substrate 120 act as paths through which light emitted by the LED radiates outward while protecting the QD 140 from the external environment. For this, either the first substrate 110 or the second substrate 120 may be formed of a transparent glass substrate.

The first sealant 130 is disposed on the top surface of the first substrate 110, forming a recess-shaped accommodation space having the first substrate 110 as the bottom surface thereof. The height of the first sealant 130 disposed on the top surface of the first substrate 110 ranges from 300 to 500 μm. As illustrated in FIG. 1 and FIG. 2, the first sealant 130 disposed on the top surface of the first substrate 110 is in the shape of an oblong frame. The QD 140 is accommodated in the accommodation space defined by the first sealant 130. Thus, the first sealant 130 serves as a structure that seals the QD 140 while accommodating the QD 140. According to this embodiment, the first sealant 130 is formed of a glass frit. In particular, the first sealant 130 may be formed of a glass frit, the softening point of which ranges, for example, from 500 to 800° C., which is lower than the softening point of the first substrate 110 implemented as a glass substrate, and the coefficient of thermal expansion (CTE) of which is similar to the CTE of the first substrate 110. For example, the first sealant 130 may be formed of a ZnO—$B_2O_3$—$SiO_2$ based glass frit. The first sealant 130 is by no means limited to the ZnO—$B_2O_3$—$SiO_2$ based glass frit according to this embodiment, since the first sealant 130 may be formed of any glass frit, the softening point and the CTE of which are in the above-stated ranges. Here, the softening point of the first sealant 130 is required to be lower than the softening point of the first substrate 110 since the first substrate 110 may be transformed during sintering if the softening point of the first sealant 130 is higher than the softening point of the first substrate 110.

The QD 140 is accommodated within the accommodation space defined by the first substrate 110 and the first sealant 130. The QD 140 is hermetically sealed by the first substrate 110, the second substrate 120, the first sealant 130, and the second sealant 150, which are laser sealed, such that the QD 140 can be entirely protected from the external environment. The QD 140 is a nano-crystal of a semiconductor material having a quantum confinement effect, the diameter of which approximately ranges from 1 to 10 nm. The QD 140 converts the wavelength of light emitted by the LED, thereby generating wavelength-converted light, or fluorescent light. According to this embodiment of the present invention, the LED is implemented as a blue LED, and the QD 140 is formed of a QD material able to wavelength-convert a portion of light emitted by the blue LED to yellow light in order to produce white light by mixing the yellow light with the blue light.

The second sealant 150 is disposed between the second substrate 120 and the first sealant 130. As illustrated in FIG. and FIG. 2, the second sealant 150 is in the shape corresponding to that of the first sealant 130. That is, the second sealant 150 is disposed along the peripheries of the QD 140. With this configuration, when the first substrate 110, the second substrate 120, the first sealant 130, the QD 140, and the second sealant 150 are laser sealed, the QD 140 accommodated within the accommodation space defined by the first substrate 110 and the first sealant 130 is hermetically sealed by the first substrate 110, the second substrate 120, the first sealant 130, and the second sealant 150, thereby being entirely protected from the external environment.

According to this embodiment, the second sealant 150 is formed of a material, the ability to absorb infrared (IR) laser light of which is greater than that of the first sealant 130. The second sealant 150 may be formed of a glass frit like the first sealant 130. The softening point of the glass frit of the second sealant 150 may be lower than the softening point of the glass frit of the first sealant 130. It is preferable that the softening point of the glass frit of the second sealant 150 is lower than the softening point of the glass frit of the first sealant 130, since cracks may be caused by a thermal shock when the softening point of the second sealant 150 is higher than the softening point of the first sealant 130. The second sealant 150 may be formed of a $V_2O_5$ based glass frit or a $Bi_2O_3$—$B_2O_3$—ZnO based glass frit having a low melting point. When the second sealant 150 is formed of a $Bi_2O_3$—$B_2O_3$—ZnO based glass frit having a low melting point, the composition of the second sealant 150 may include a black pigment in order to further improve the ability to absorb IR laser light. The black pigment in the second sealant 150 may be a $MnO_2$—$Fe_2O_3$ based material, the content of which may range, by weight, from 2% to 10% of the second sealant 150. When the content of the black pigment exceeds 10% by weight, the physical properties of the second sealant 150 change. When the content of the black pigment is less than 2% by weight, the ability to absorb laser light within the IR wavelength range is reduced. This consequently makes hermetic sealing difficult.

A description of a color conversion substrate for an LED according to another exemplary embodiment of the invention will be given below with reference to FIG. 3 and FIG. 4.

Figure 3:
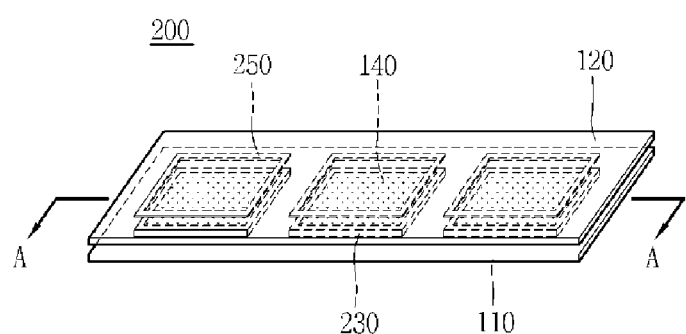
FIG. 3 is a perspective view illustrating a color conversion substrate for an LED according to another exemplary embodiment of the present invention.
Figure 4:
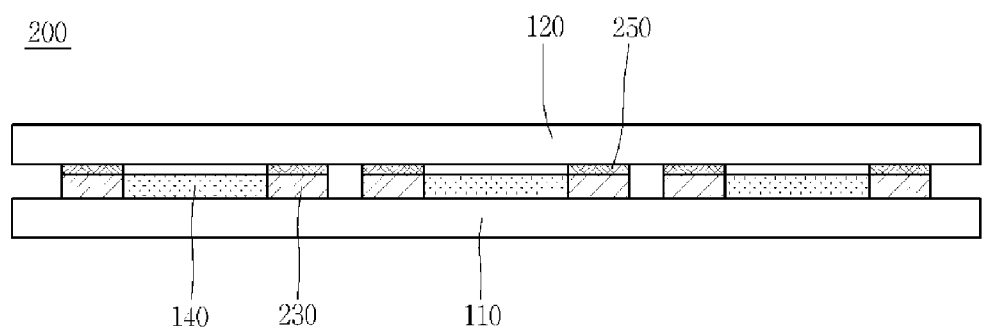
FIG. 4 is a cross-sectional view taken along line A-A in FIG. 3.

FIG. 3 is a perspective view illustrating the color conversion substrate for an LED according to this exemplary embodiment of the present invention, and FIG. 4 is a cross-sectional view taken along line A-A in FIG. 3.

As illustrated in FIG. 3 and FIG. 4, the color conversion substrate 200 for an LED according to this embodiment includes a first substrate 110, a second substrate 120, a first sealant 230, a plurality of QDs 140, and a second sealant 250.

This embodiment is substantially identical to the former embodiment except that the first sealant is disposed on the first substrate such that a plurality of accommodation spaces is defined on the single first substrate, and that the second sealant is in the shape corresponding to that of the first sealant. Therefore, the same reference numerals will be used to designate the same or like parts, and detailed descriptions thereof will be omitted.

The color conversion substrate 200 for an LED according to this embodiment may be a substrate applicable to a plurality of LEDs that is used as a backlight source of large display or a light source of a wide area lighting apparatus. Alternatively, the color conversion substrate 200 for an LED according to this embodiment may be a bulk substrate before being divided into cells, each of which is based on a single QD 140, and is applied to the corresponding one of the same number of LEDs.

For this, the first sealant 230 is formed on the first substrate 110 to define a plurality of accommodation spaces conforming to an array of a plurality of LEDs disposed under the first substrate 110. The plurality of QDs 140 is accommodated in the plurality of accommodation spaces. The second sealant 250 is formed between the bottom surface of the second substrate 120 facing the first substrate 110 and the first sealant 230. The shape of the second sealant 250 corresponds to or matches the shape of the first sealant 230.

As described above, in the color conversion substrates 100 and 200 according to the embodiments of the invention, the first sealant 130/230 defines the accommodation space(s) in cooperation with the first substrate 110 in order to accommodate the QD(s) 140, and the second sealant 150/250 formed of a glass frit, the ability to absorb IR laser light of which is greater than that of the first sealant 130/230, and the softening point of which is lower than that of the first sealant 130/230, provides a hermetic seal. This configuration allows localized heating of the second sealant 150/250 during laser sealing, preventing cracks that would otherwise be caused by a thermal shock. This can consequently provide a hermetic seal, by which the QD(s) 140 is entirely protected from the external environment, thereby increasing the lifespan of an LED package including the color conversion substrate 100/200.

A description of a method of fabricating a color conversion substrate for an LED according to an exemplary embodiment of the invention will be given below with reference to FIG. 5 to FIG. 8.

Figure 5:
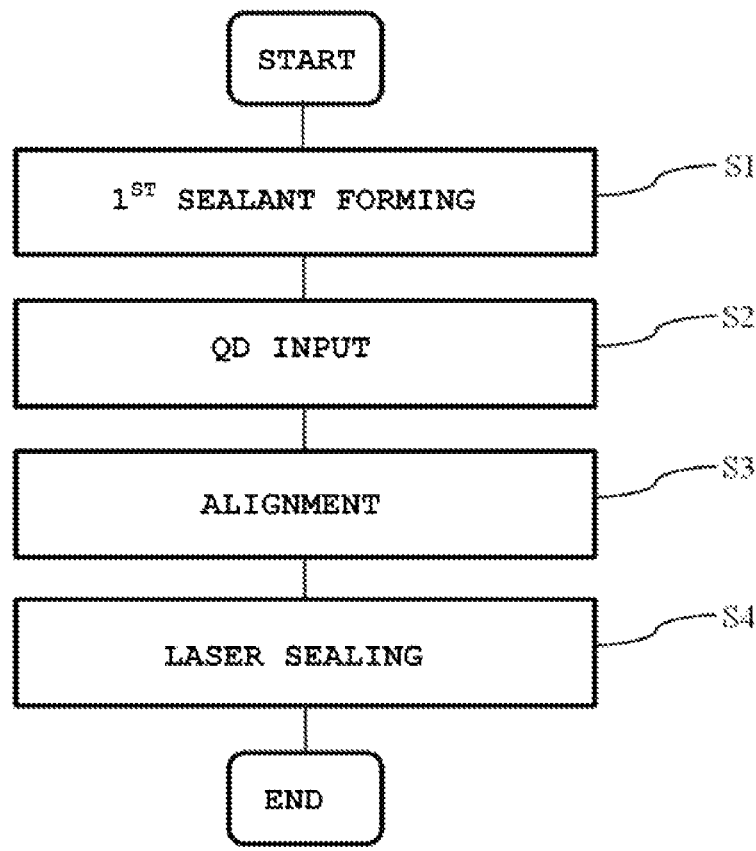
FIG. 5 is a process flowchart illustrating a method of fabricating a color conversion substrate for an LED according to another exemplary embodiment of the present invention.

As illustrated in FIG. 5, the method of fabricating a color conversion substrate for an LED according to this embodiment includes first sealant forming step S1, QD input step S2, alignment step S3, and laser sealing step S4. In the following description of the method of fabricating a color conversion substrate for an LED according to this embodiment, the color conversion substrate for an LED will be illustrated as being an LED color conversion substrate applicable for a backlight source of a display or a light source of a wide area lighting apparatus.

Figure 6:
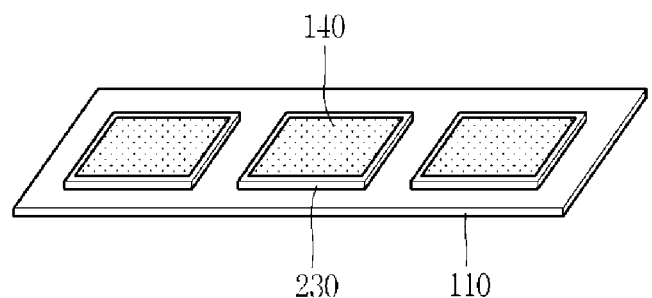
FIG. 6 to FIG. 8 are process views sequentially illustrating the operations of a method of fabricating a color conversion substrate for an LED according to an exemplary embodiment of the present invention.

First, as illustrated in FIG. 6, at the first sealant forming step S1, a first sealant 230 is formed on the top surface of a first substrate 110 under which LEDs are supposed to be disposed, defining recess-shaped accommodation spaces having the first substrate 110 as the bottom surfaces thereof. Specifically, at the first sealant forming step S1, the first sealant 230 formed of a paste of glass frit applied on the first substrate 110 to a height ranging, for example, from 300 to 500 μm such that a plurality of the accommodation spaces is defined on the first substrate 110, and subsequently is sintered. The first sealant 230 in the shape of the paste may be applied on the top surface of the first substrate 110 by printing or using a dispenser. At the first sealant forming step S1, the first sealant 230 may be formed of a glass frit, the softening point of which is lower than the softening point of the first substrate 110 implemented as the glass substrate, and the CTE of which is similar to the CTE of the first substrate 110. For example, the first sealant 230 may be formed of a $ZnO$—$B_2O_3$—$SiO_2$ based glass frit. Furthermore, a ceramic filler may be added to the first sealant 230 in order to increase the strength of the first sealant 230.

Afterwards, at the QD input step S2, the QD 140 is input into the accommodation spaces defined by the first substrate 110 and the first sealant 230. Specifically, at the QD input step S2, a QD material able to wavelength-convert a portion of light emitted by a blue LED to yellow light is input into each of the plurality of divided accommodation spaces.

Figure 7:
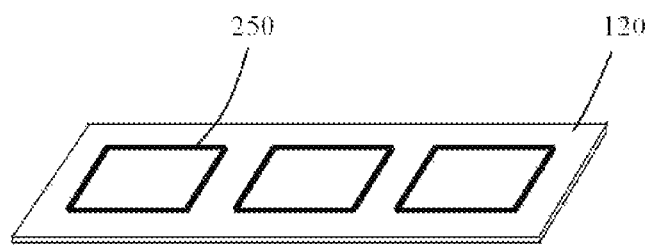

Thereafter, at the alignment step S3, a second sealant 250 and a second substrate 120 disposed on the second sealant 250 are aligned on the first sealant 230 that defines the plurality of accommodation spaces, the second substrate 120 facing the first substrate 110. Here, the second sealant 250 is disposed on and aligned with the first sealant 230, in the shape corresponding to the shape of the first sealant 230. The alignment step S3 may include disposing the second substrate 120 implemented as a glass substrate on the second sealant 250 and subsequently disposing the second sealant 250 on the first sealant 230. Alternatively, as illustrated in FIG. 7, the alignment step S3 may include applying the second sealant 250 formed of a paste of glass frit on the bottom surface of the second substrate 120 (with reference to FIG. 8), sintering the applied second sealant 250, and subsequently disposing the second substrate 120 on the first sealant 230 such that the second sealant 250 comes into close contact with the first sealant 230.

At the alignment step S3, a glass frit, the ability to absorb IR laser light of which is greater than that of the first sealant 230, and the softening point of which is lower than that of the first sealant 230, may be used to form the second sealant 250. For example, a low melting point glass frit, such as a $V_2O_5$ based glass frit or a $Bi_2O_3$—$B_2O_3$—$ZnO$ based glass frit, may be used to form the second sealant 250 at the alignment step S3. When the second sealant 250 is formed of the $Bi_2O_3$—$B_2O_3$—$ZnO$ based low melting point glass frit, a black pigment formed of, for example, a $MnO_2$—$Fe_2O_3$ based material, may be added in order to improve the ability to absorb IR laser light. The content of the black pigment may range, by weight, from 2% to 10% of the second sealant 150.

Finally, at the laser sealing step S4, a laser beam is provided onto the second sealant 250, sealing the first substrate 110, the first sealant 230, the second sealant 250, and the second substrate 120 to each other. In this case, the second sealant 250 having the higher ability to absorb IR laser light is locally heated. This can consequently protect the first sealant 230 from cracks that would otherwise be caused by a thermal shock, thereby forming a hermetic seal.

Figure 8:
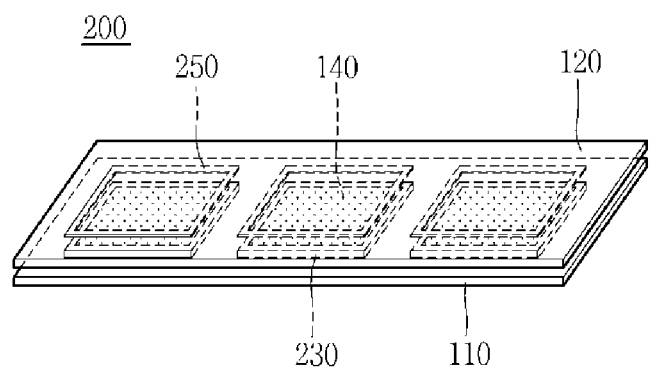

When the laser sealing step S4 is completed as above, a color conversion substrate 200 for an LED according to an embodiment of the invention is fabricated, as illustrated in FIG. 8. When the color conversion substrate 200 for an LED is fabricated by the fabrication method according to this embodiment, a related-art multilayer coating process intended to protect the QDs is omitted, thereby reducing fabrication costs compared to that of the related art. In addition, a related-art etching coating process required for the accommodation of the QDs is omitted, whereby limitations in the thickness of the substrate are removed.

The color conversion substrate 200 fabricated by the fabrication method according to this embodiment is applicable for a backlight source of a display or a light source of a wide area lighting apparatus. In addition, the color conversion substrate 200 may be divided into a plurality of cells, each of which is used as a color conversion substrate (see 100 in FIG. 1) for an LED. For this purpose, the fabrication method according to this embodiment may further include, after the laser sealing step S4, dicing the color conversion substrate into cells, each of which accommodates a single QD of the plurality of QDs 140. As set forth above, according to this embodiment, it is possible to facilitate the mass production of the color conversion substrate (100 in FIG. 1) applicable to an individual LED by fabricating the bulk color conversion substrate 200 and subsequently dicing the bulk color conversion substrate 200 into a plurality of cells.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

EXPLANATION OF REFERENCE NUMERALS 100, 200: color conversion substrate
110: first substrate, 120: second substrate,
130, 230: first sealant, 140: QD
150, 250: second sealant

What is claimed is:

1. A color conversion substrate for a light-emitting diode comprising:
   a first substrate disposed over the light-emitting diode;
   a second substrate facing the first substrate;
   a first sealant disposed on a top surface of the first substrate, the first sealant defining a recess-shaped accommodation space having the top surface of the first substrate as a bottom surface thereof;
   a quantum dot accommodated in the accommodation space; and
   a second sealant disposed between the second substrate and the first sealant, wherein a shape of the second sealant is substantially similar to a shape of the first sealant,
   wherein the second sealant contacts the first sealant, and
   wherein the second sealant comprises a material having a greater ability to absorb infrared laser light than that of the first sealant.

2. The color conversion substrate according to claim 1, wherein each of the first substrate and the second substrate comprises a glass substrate, and each of the first sealant and the second sealant comprises a glass frit.

3. The color conversion substrate according to claim 2, wherein a softening point of the glass frit of the first sealant is lower than a softening point of the first substrate.

4. The color conversion substrate according to claim 3, wherein a softening point of the glass frit of the second sealant is lower than a softening point of the glass frit of the first sealant.

5. The color conversion substrate according to claim 1, wherein a composition of the second sealant comprises, by weight, 2 to 10% of a black pigment.

6. The color conversion substrate according to claim 1, wherein a height of the first sealant formed on the top surface of the first substrate ranges from 300 to 500 μm.

* * * * *